(12) United States Patent
Malhotra (10) Patent No.: US 10,454,485 B1
(45) Date of Patent: Oct. 22, 2019

(54) BAUD RATE CLOCK AND DATA RECOVERY (CDR) FOR HIGH SPEED LINKS USING A SINGLE 1-BIT SLICER

(71) Applicant: Samsung Display Co., Ltd., Yongin, Gyeonggi-Do (KR)

(72) Inventor: Gaurav Malhotra, Cupertino, CA (US)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 16/117,882

(22) Filed: Aug. 30, 2018

Related U.S. Application Data

(60) Provisional application No. 62/688,241, filed on Jun. 21, 2018.

(51) Int. Cl.
*H03D 3/24* (2006.01)
*H03L 7/091* (2006.01)
*H04L 7/00* (2006.01)
*H03L 7/093* (2006.01)

(52) U.S. Cl.
CPC .............. *H03L 7/091* (2013.01); *H04L 7/007* (2013.01); *H03L 7/093* (2013.01); *H04L 7/0062* (2013.01)

(58) Field of Classification Search
CPC ......... H03L 7/091; H03L 7/007; H03L 7/093; H04L 7/0062
USPC .......................... 375/354, 355, 371, 373, 376
See application file for complete search history.

(56) References Cited

U.S. PATENT DOCUMENTS

| 7,158,601 | B1 | 1/2007 | Chew | |
|---|---|---|---|---|
| 7,502,815 | B1 | 3/2009 | Drimer | |
| 8,923,380 | B1 * | 12/2014 | Malhotra | H04B 1/16 375/232 |
| 8,934,594 | B1 * | 1/2015 | Malhotra | H04L 27/2338 375/355 |
| 9,215,061 | B2 | 12/2015 | Hammad et al. | |
| 9,350,572 | B1 | 5/2016 | Kang et al. | |
| 9,438,409 | B1 * | 9/2016 | Liao | H04L 7/0062 |
| 9,582,018 | B1 * | 2/2017 | Wang | G05F 1/625 |
| 2004/0223568 | A1 | 11/2004 | Liu | |
| 2011/0311009 | A1 * | 12/2011 | Flynn | G01R 13/0218 375/354 |
| 2012/0170621 | A1 * | 7/2012 | Tracy | H04L 25/03038 375/219 |
| 2012/0230454 | A1 * | 9/2012 | Mobin | H04L 7/0083 375/354 |
| 2012/0257652 | A1 * | 10/2012 | Malipatil | H04L 7/0062 375/219 |
| 2013/0148712 | A1 * | 6/2013 | Malipatil | H04L 25/0307 375/233 |
| 2013/0243070 | A1 * | 9/2013 | Ito | H04L 27/01 375/233 |

(Continued)

*Primary Examiner* — Tesfaldet Bocure
(74) *Attorney, Agent, or Firm* — Innovation Counsel LLP (57) ABSTRACT

An apparatus for providing timing recovery in high speed links includes: an error sampler receiving an input signal and sampling the input signal; a phase detector comprising an error slicer; and a voltage-controlled oscillator (VCO). The error slicer generates an error signal corresponding to the input signal with respect to a voltage threshold. The phase detector generates a bit data corresponding to the error signal. The VCO changes a frequency of an output signal based on the bit data and locks the frequency at a phase in which an average of a plurality of input signals is equal to the voltage threshold.

18 Claims, 12 Drawing Sheets

(56) References Cited

U.S. PATENT DOCUMENTS

| | | | |
|---|---|---|---|
| 2013/0243071 A1* | 9/2013 | Chmelar | H04L 25/063 375/233 |
| 2013/0243107 A1* | 9/2013 | Chmelar | H04L 25/03057 375/259 |
| 2016/0065394 A1* | 3/2016 | Sindalovsky | H04L 25/03012 375/371 |

* cited by examiner

|  | Previous data | Current data | Next data |
|---|---|---|---|
| Example 1 | n/a | +1 | n/a |
| Example 2 (Pattern screen 1) | -1 | +1 | n/a |
| Example 3 (Pattern screen 2) | -1 | +1 | -1 |

BAUD RATE CLOCK AND DATA RECOVERY (CDR) FOR HIGH SPEED LINKS USING A SINGLE 1-BIT SLICER

CROSS-REFERENCE TO RELATED APPLICATION(S)

This application claims the benefits of and priority to U.S. Provisional Patent Application Ser. No. 62/688,241 filed Jun. 21, 2018, the disclosure of which is incorporated herein by reference in its entirety.

TECHNICAL FIELD

The present disclosure relates generally to clock and data recovery for high speed links, more particularly, to a system and method for providing clock and data recovery using a single 1-bit slicer.

BACKGROUND

Typically, timing recovery in serializer/deserializer (SerDes) links for data transmission is done using a phase detector. An example of the phase detector is a bang-bang phase detector commonly used in optical transmission. A bang-bang phase detector does not contain any information about the absolute value of the phase error but only about its sign. The bang-bang phase detector uses 2 slicers including a first slicer referred to as a data slicer that samples in the center of an eye and a second slicer referred to as a crossing slicer that samples at the zero crossings. The use of two (or more) slicers in the SerDes links may provide increased performance but at the sacrifice in terms of power, complexity, a design time, and a required surface area due to the additional analog circuits required to implement the two (or more) slicers to support the complexity of the associated phase-locked loop (PLL) algorithm.

SUMMARY

According to one embodiment, an apparatus for providing timing recovery in high speed links includes: an error sampler receiving an input signal and sampling the input signal; a phase detector comprising an error slicer; and a voltage-controlled oscillator (VCO). The error slicer generates an error signal corresponding to the input signal with respect to a voltage threshold. The phase detector generates a bit data corresponding to the error signal. The VCO changes a frequency of an output signal based on the bit data and locks the frequency at a phase in which an average of a plurality of input signals is equal to the voltage threshold.

According to another embodiment, a method includes: receiving and sampling an input signal transmitted from a transmitter; generating an error signal corresponding to the input signal with respect to a voltage threshold using an error slicer; generating a bit data corresponding to the error signal using a phase detector; changing a frequency of an output signal based on the bit data; and locking the frequency at a phase in which an average of a plurality of input signals is equal to the voltage threshold.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

The present disclosure describes a technique for timing recovery (also termed as clock recovery) in high-speed serializer/deserializer (SerDes) links. The present system and method uses only one slicer, e.g., a data slicer and does not require a crossing slicer. In contrast, conventional bang-bang phase-locked loop (PLL) uses both a data slicer and a crossing slicer. Saving one slicer in analog and/or digital circuits of can be advantageous in terms of power, complexity, and area. The present system and method can save a design time to implement a clock and data recovery (CDR) module while providing a performance that is comparable or exceeding conventional bang-bang PLL including two slicers.

An error slicer is commonly used in timing recovery arts in conjunction with a data slicer. The present system and method acquires a frequency lock using only one slicer, i.e., an error slicer. The frequency lock means that the receiver and transmitter are synchronized in a frequency domain. The present system and method neither uses nor requires any crossing slicer at all. The advantages and benefits of the present system and method are readily apparent to anyone having ordinary skill in the art as discussed above and the following detailed description of the present inventive concept.

Figure 1:
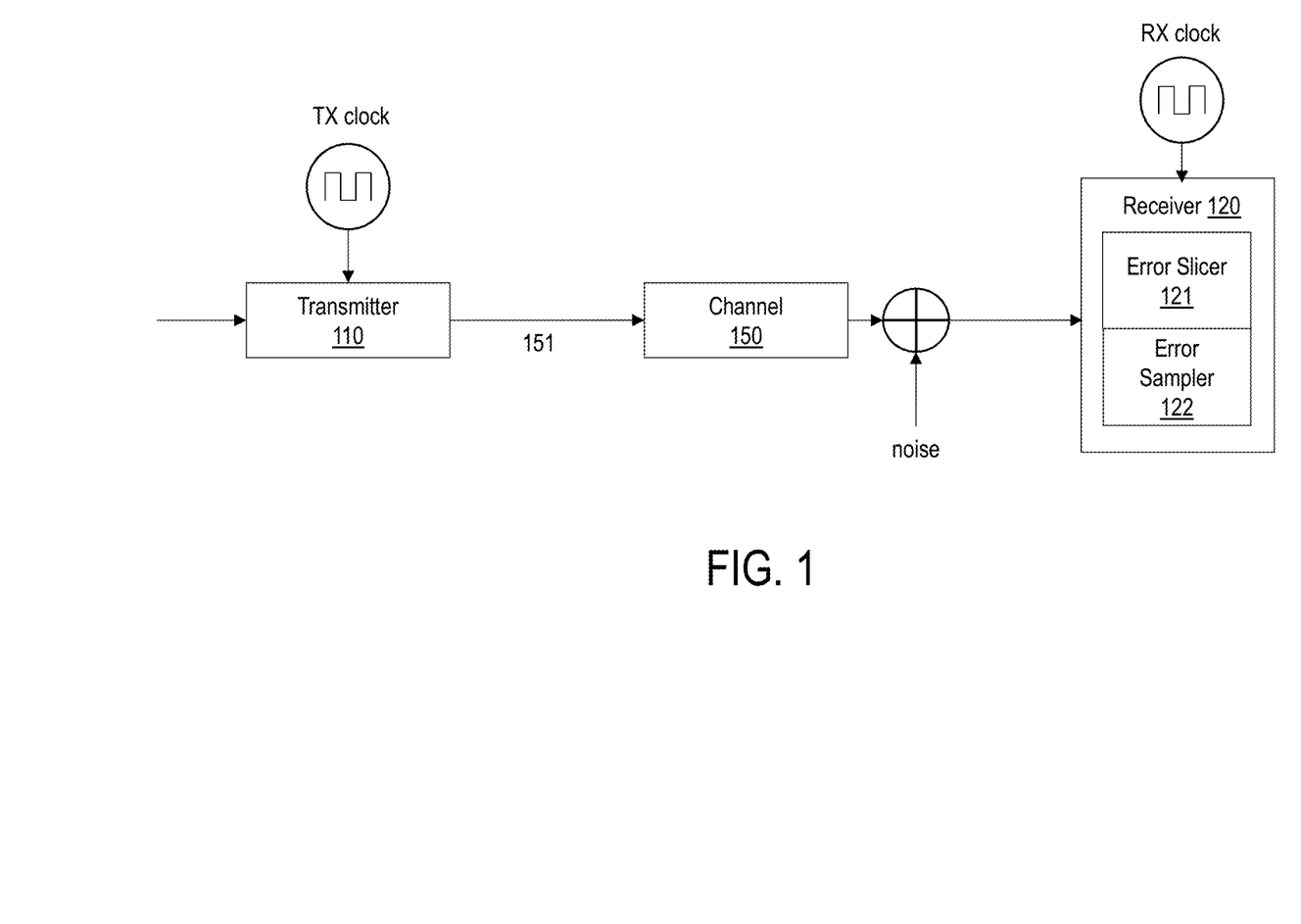
FIG. 1 shows an example timing recovery system, according to one embodiment.

FIG. 1 shows an example timing recovery system, according to one embodiment. A transmitter 110 sends data to a receiver 120 over a channel 150. The channel 150 may represent medium of signal path transmission, for example, a copper trace. The received data over the channel 150 may include noise signals. The characteristics of the noise signal may heavily depend on the frequency of the transmission signals and the environment in which the signals are transmitted. For the purpose of design verification and describing the inventive concept of the present disclosure, the data that the transmitter 110 sends to the receiver 120 is considered to be random data. In practice, however, the data can be specific to an application and usage that may exhibit certain data patterns. Such data patterns may be irrelevant to the present timing recovery scheme, and the present timing recovery scheme can handle any data signals without deviating from the scope of the present disclosure. The receiver 120 includes an error slicer 121 and an error sampler 122. Each component of the receiver 120 may be implemented in hardware (e.g., analog/digital circuits), software, or a combination of both. The detailed function of the error slicer 121 and the error sampler 122 are described in more detail with respect to FIGS. 2A and 2B.

Figure 2A:
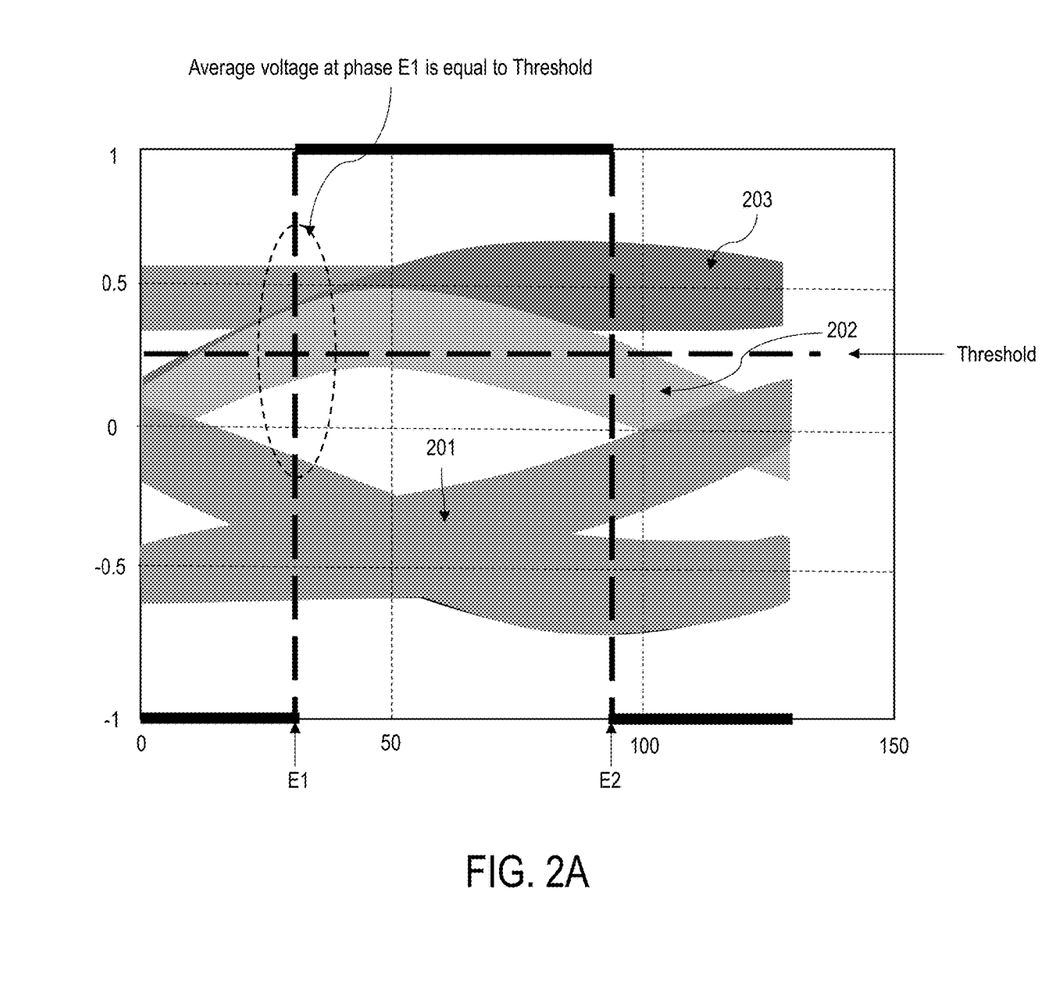
FIG. 2A is an example data eye diagram showing a locked phase based on an average voltage, according to one embodiment.

FIG. 2A is an example data eye diagram showing a locked phase based on an average voltage, according to one embodiment. A data eye diagram is formed by overlapping sampled signal waveforms over a specified time interval referred to as a unit interval (UI) and provides a qualitative means to evaluate link performance and to troubleshoot system issues. On the receiver side, the receiver 120 sets a pre-determined voltage threshold and uses this voltage threshold to produce an error output using the error slicer 121. Similar to a bang-bang comparator, the error slicer 121 uses a sign of the error. The present error slicer employs a timing recovery algorithm to perform a frequency lock between the transmitting (Tx) frequency and the receiving (Rx) frequency. The receiver 120 further includes the error sampler 122 that samples the received signals from the transmitter 110. The receiver 120 locks its clock at a phase such that the error sampler 122 samples input bit streams at the voltage threshold on an average.

The unit interval (UI) shows bit streams overlapped in the unit interval over a sampling period. The amplitude of the sampled bit streams fluctuate over a range (e.g., between −1 volt and 1 volt that represent bit signal 0 and bit signal 1, respectively) in the y-axis, and the x-axis of the plot represents a time scale (e.g., 0 to 130 picoseconds) indicating a phase of each bit stream within the unit interval. In other embodiments, the x-axis of the plot may represent a phase angle in degrees, where 0 degree corresponds to a start time, and 360 degree corresponds to an end time (e.g., 130 picoseconds) of each bit stream. The receiver locks its clock at a phase E1 at which the average voltage of the bit streams sampled by the error sampler 122 is equal to the threshold voltage. The region 201 represents the entire signal's eye diagram. The region 202 represents a portion of the eye diagram where signal transition from 0 to 1, and back to 0. The region 203 represents a portion of the eye diagram where signal transition from 0 to 1.

Figure 2B:
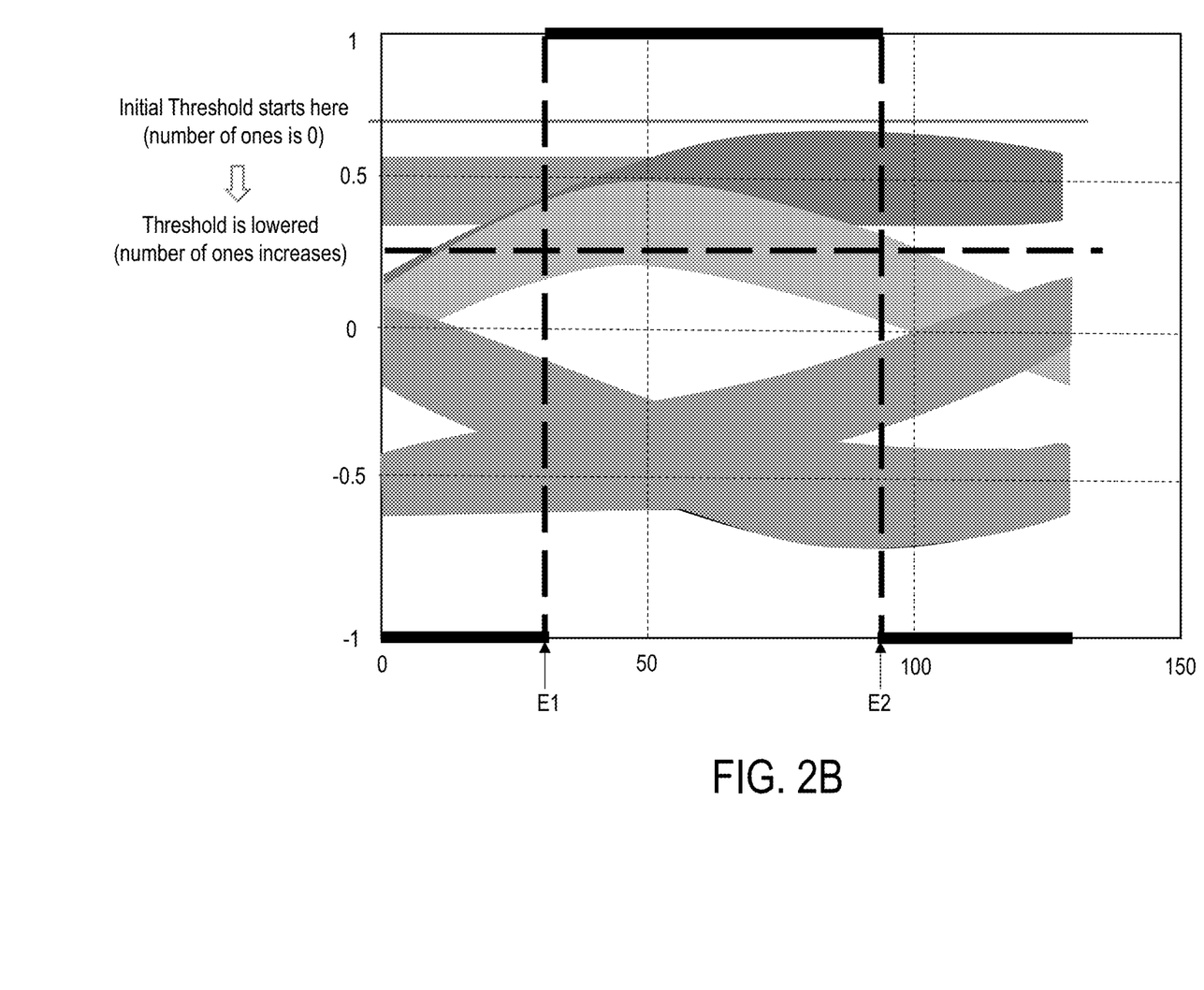
FIG. 2B shows an example data eye diagram illustrating a process of setting a threshold voltage, according to one embodiment.

FIG. 2B shows an example data eye diagram illustrating a process of setting a threshold voltage, according to one embodiment. The receiver detects a peak voltage in the unit interval. The initial detection of the peak voltage can be a rough estimate. Initially, the threshold voltage (V_threshold) can be set with respect to the peak voltage. For example, the threshold voltage is set to be a half of the peak voltage or a third of the peak voltage. It is noted that the initial threshold voltage can be set arbitrarily depending on various factors such as a target application (e.g., optical transmission, wireless transmission), the design and architecture of the receiver, and a choice of a designer.

To detect the peak voltage, the receiver starts with a high value of the threshold voltage and monitors an output of the error slicer 121 by counting the number of ones in N cycles (e.g., 1000 cycles). Initially, the count of ones may be zero because the initial threshold is set too high. When the number of ones becomes greater than some of pre-set value (e.g., 100), the threshold voltage is set to the peak voltage. The receiver sets the initial threshold voltage (e.g., half of the peak voltage) and run a clock data recovery (CDR) loop. As the threshold voltage is lowered from the initial value, the number of ones increases in the N cycles as shown in FIG. 2B.

Figure 3:
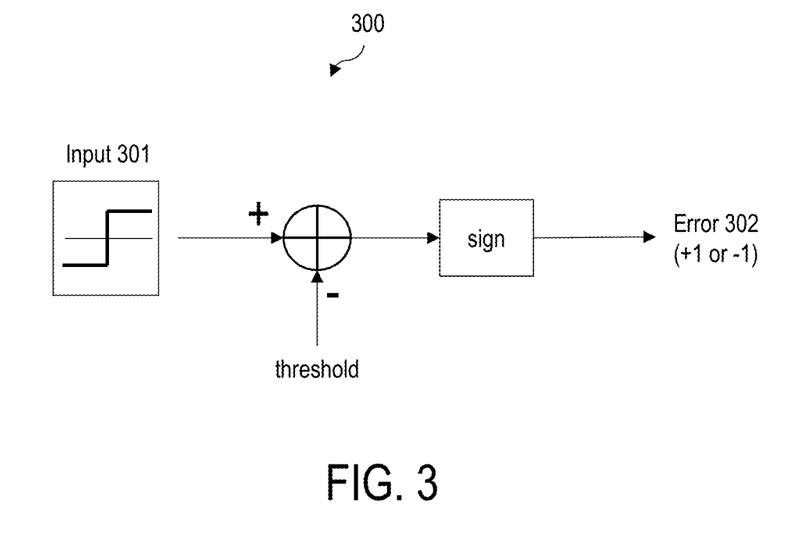
FIG. 3 shows a block diagram of an example error slicer, according to one embodiment.

FIG. 3 shows a block diagram of an example error slicer, according to one embodiment. The error slicer 300 receives an input signal 301 and generates an error output 302 (positive error (+1) or negative error (−1)) based on a comparison result of the input signal 301 (e.g., a voltage of the input signal 301) to a threshold. For example, the input signal 310 is a voltage signal of a bit stream that is transmitted from the transmitter 110, and the threshold represents a threshold voltage. The error slicer 300 outputs +1 when the voltage of the input signal is greater than the threshold voltage and −1 when the voltage of input signal is less than the threshold voltage. Based on the sign output from the error slicer 300, the receiver 120 can change its sampling frequency (also referred to as a receiver frequency) using a voltage-controlled oscillator (VCO) that increases the frequency of a PWM signal when the error is +1 and decreases the frequency of the PWM signal when the error is −1.

Figure 4:
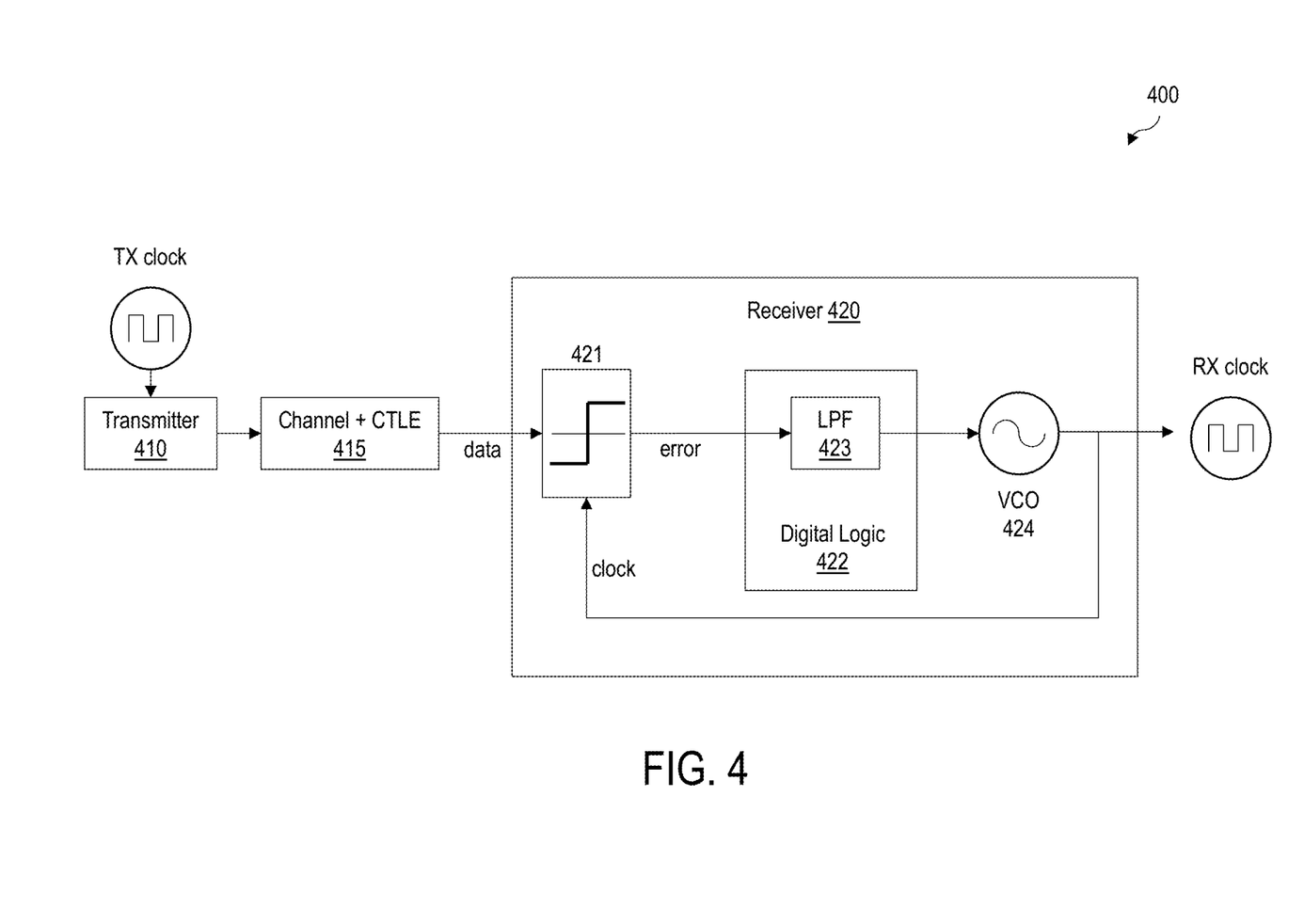
FIG. 4 shows a block diagram of an example timing recovery system, according to one embodiment.

FIG. 4 shows a block diagram of an example timing recovery system, according to one embodiment. The system 400 includes a transmitter 410 and a receiver 420. The signals that the transmitter 410 transmits to the receiver 420 passes through a channel and a continuous time linear equalizer (CTLE), collectively herein referred to as 415, for initial filtering, then the output data is forwarded to an error slicer 421 that generates an error signal. The error signal is fed to a low-pass filter 423 included in a digital logic 422 of the receiver 420, and the filtered signal is fed to a voltage-controlled oscillator (VCO) 424. The VCO 424 generates a receiver (RX) frequency that varies based on the low-pass filtered error signal. The receiver frequency increases if the error is positive (+1) and decreases if the error is negative (−1). The output from the VCO 424 is fed back to the error slicer 421 to continuously monitor and change the error signal of the input bit streams.

In a conventional CDR module such as a bang-bang PLL, a phase detector compares a phase input (Øin) with a phase output (Øout) to generate an error output. In the present system and method, however, a voltage of an input bit stream is used as an input to the error slicer 421 to generate an error output that is filtered by the LPF 423 and fed to the VCO 424.

Figure 5:
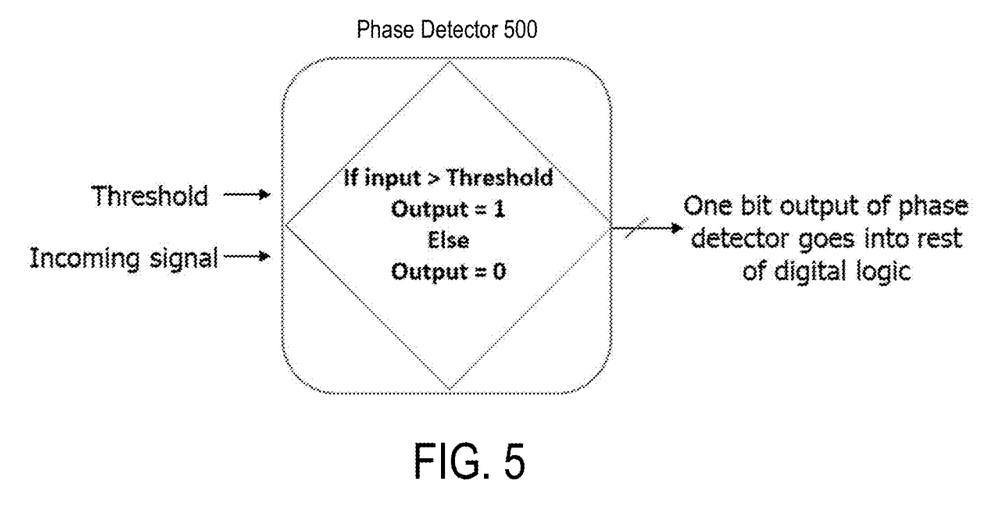
FIG. 5 shows a block diagram of a phase detector, according to one embodiment.

FIG. 5 shows a block diagram of a phase detector, according to one embodiment. The phase detector 500 includes an error slicer, for example, the error slicer 121 of FIG. 1. The phase detector 500 may further include a digital logic that conditions noisy input signals (e.g., low-pass filter) and produces a bit output corresponding to a sign of the output of the error slicer 300. The rest of the digital logic of the receiver operates based on this bit output from the phase detector 500. When the slicer input is greater than the threshold, the error slicer generates a positive error output (+1), and the phase detector 500 outputs bit 1. The VCO of the receiver uses this bit 1 to increase the receiver frequency. When the slicer input is less than the threshold, the error slicer generates a negative error output (−1), and the phase detector 500 outputs bit 0. The VCO of the receiver uses this bit 0 to decrease the receiver frequency. This is different from a conventional use of a phase detector for clock and data recovery. In a conventional oversampled timing recovery scheme (e.g., a bang-bang phase detector), the phase detector compares a phase of input (Øin) with the phase of output (Øout). In contrast, the present phase detector compares the voltage of an input (a function of Øin) with the V_threshold to generate the error. For example, Mueller-Muller based phase detectors requires an analog to digital (ADC) converter having a multi-bit output and a complex digital signal processing (DSP) logic to estimate a channel.

Figure 6A:
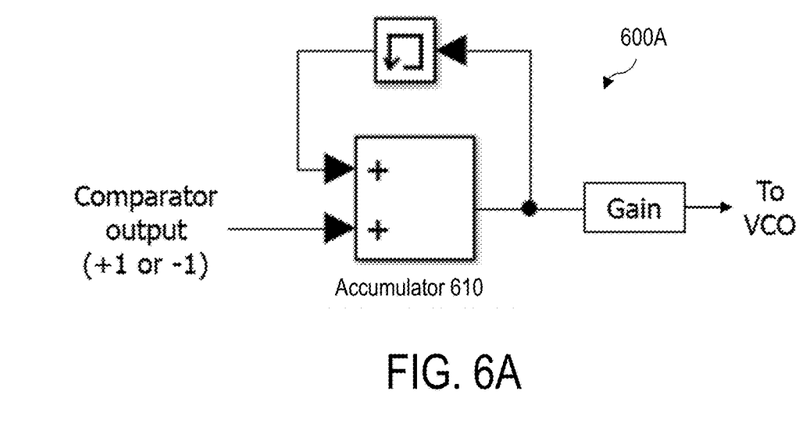
FIG. 6A shows a block diagram of a low-pass filter (LPF) included in the receiver, according to one embodiment.
Figure 6B:
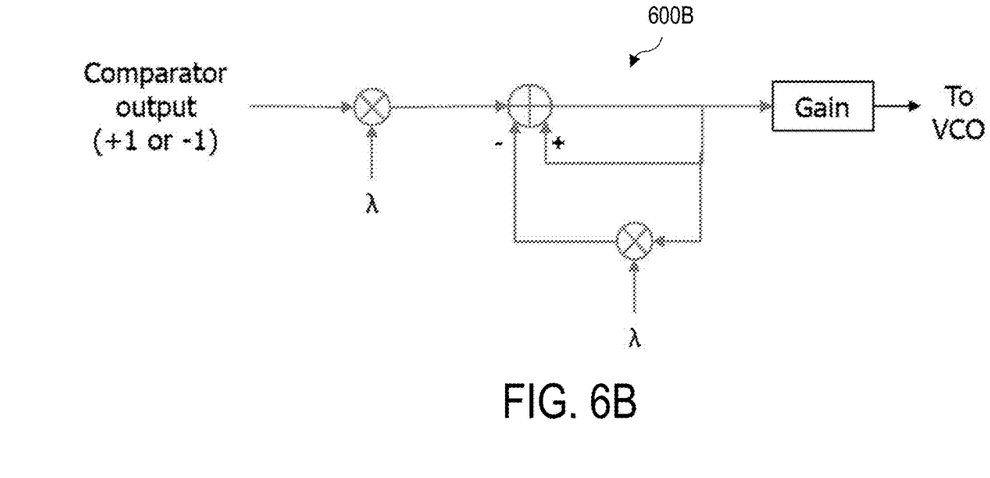
FIG. 6B shows a block diagram of a low-pass filter (LPF) included in the receiver, according to another embodiment.

FIG. 6A shows a block diagram of a low-pass filter (LPF) included in the receiver, according to one embodiment. The low-pass filter 600A includes an accumulator 610 that smooths out short-term variations in the input signal (error sign of the error slicer) and applies a gain to feed the filtered error signal to the voltage-controlled oscillator of the receiver. For example, the accumulator 610 in the low-pass filter 600A is an integrator. FIG. 6B shows a block diagram of a low-pass filter (LPF) included in the receiver, according to another embodiment. The low-pass filter 600B a leaky integrator, where X is a small number, for example, $2^{-N}$. Although only two examples of the low-pass filters are shown in FIGS. 6A and 6B, it is understood that different types of low-pass filters may be used without deviating from the scope of the present disclosure.

Figure 7:
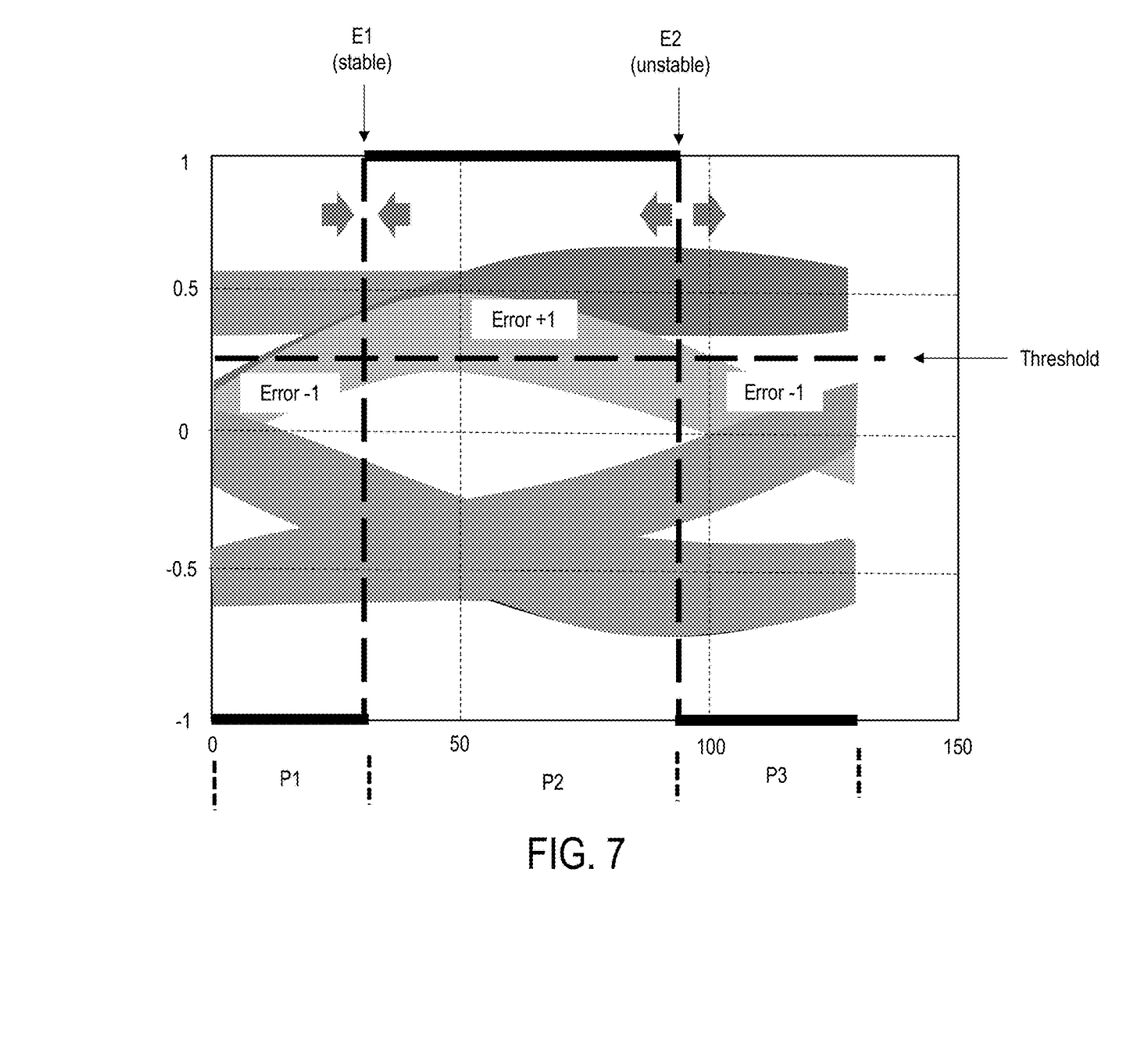
FIG. 7 shows an example data eye diagram showing two equilibrium points, according to one embodiment.

FIG. 7 shows an example data eye diagram showing two equilibrium points, according to one embodiment. An equilibrium point corresponds to a phase in the data eye diagram at which an average voltage of the input bit streams is equal to the threshold. When a unique local minima exists, convergence is guaranteed. In the present data eye diagram, two equilibrium points E1 and E2 are shown. Because the average voltage at a phase in P2 is greater than the threshold, and the error output in P2 is positive (+1), the receiver decreases the frequency toward the equilibrium E1. Similarly, because the average voltage at a phase in P1 is less than the threshold, and the error output in P2 is negative (−1), the receiver increases the frequency toward the equilibrium E1. Therefore, the equilibrium E1 is a stable equilibrium. However, even if the initial voltage threshold is set at the equilibrium E2, a slight variation in the receiver frequency would diverge away from the equilibrium E2. Therefore, the equilibrium E2 is an unstable equilibrium. According to the present single slicer CDR scheme, two equilibrium points exist, and only one equilibrium point is stable, and the other equilibrium point is unstable.

Figure 8:
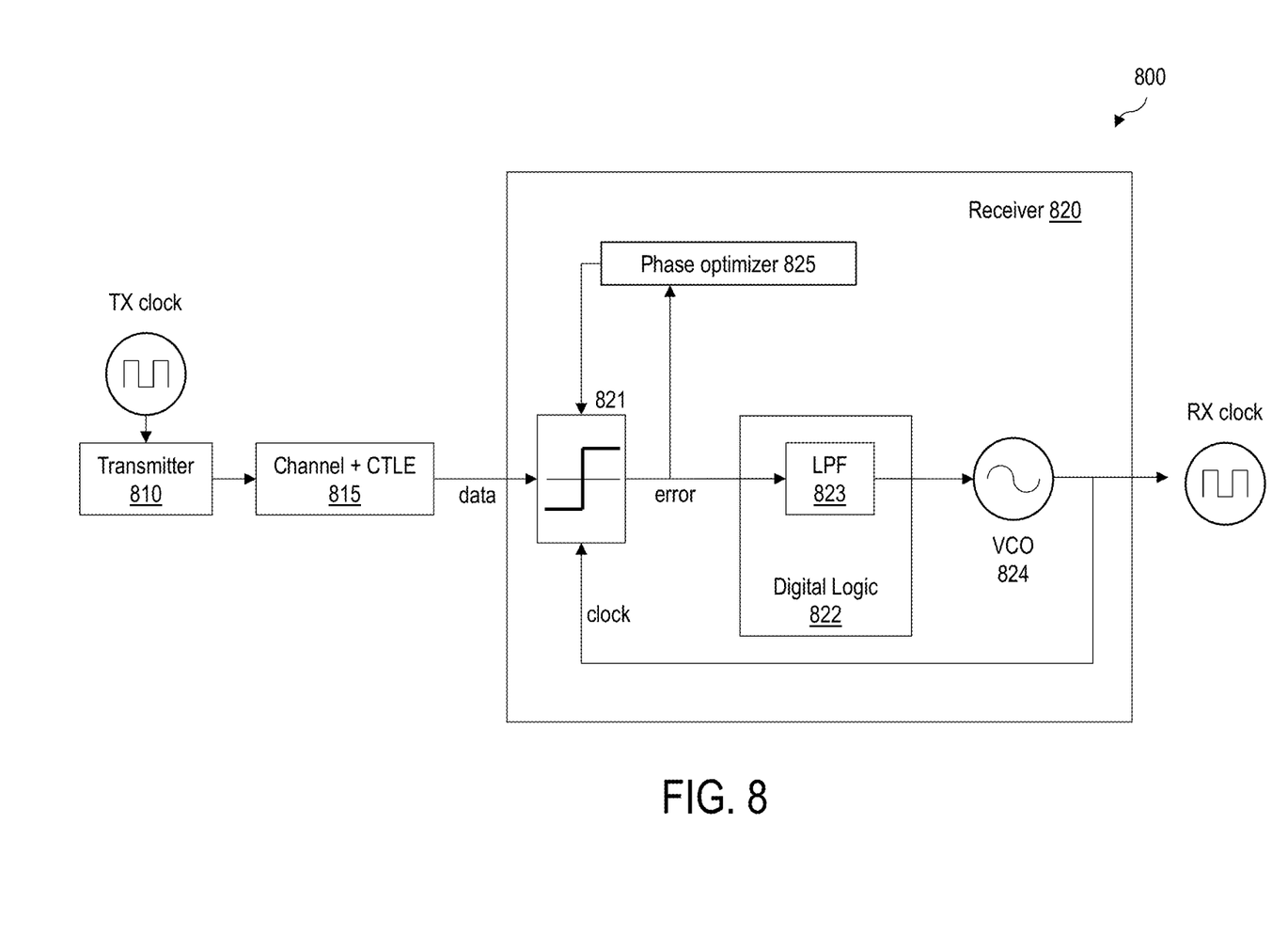
FIG. 8 shows a block diagram of an example timing recovery system including a phase optimizer, according to one embodiment.

FIG. 8 shows a block diagram of an example timing recovery system including a phase optimizer, according to one embodiment. The system 800 includes a transmitter 810 and a receiver 820. The system 800 is similar to the system 400 of FIG. 4 except that the receiver 820 includes a phase optimizer 825. Therefore, the duplicate of description for the previously described elements of the system will be omitted. Once the frequency lock is acquired, the receiver 820 optimizes the sampling phase to fall at a phase where the vertical eye opening is maximum using the phase optimizer 825. The vertical eye opening refers to the gap (y-axis) between the top of the eye (above 0V) and the bottom (below 0V). The phase optimizer 825 changes the threshold in small steps while monitoring the error. According to one embodiment, the phase optimizer 825 runs a state machine. The phase optimization state machine is a piece of the digital logic that receives an error as its input and produces a new threshold value for the error slicer as its output.

Example parameters of the phase optimization state machine are a step size, a wait cycle, and error limit. The step size refers to an amount of increase in the threshold. The wait cycle is the number of cycles to wait to take an average at the new phase. The error limit is used to determine when to start and stop reiteration of the phase optimization. If an absolute value of the error is less than the error limit, the phase optimizer increases the threshold and start another reiteration to optimize the phase, otherwise the phase optimizer decreases the threshold and stop the current phase optimization. The phase optimizer can take its input from the output signal from the low-pass filter (low-pass filter 600 shown in FIG. 6).

Figure 9:
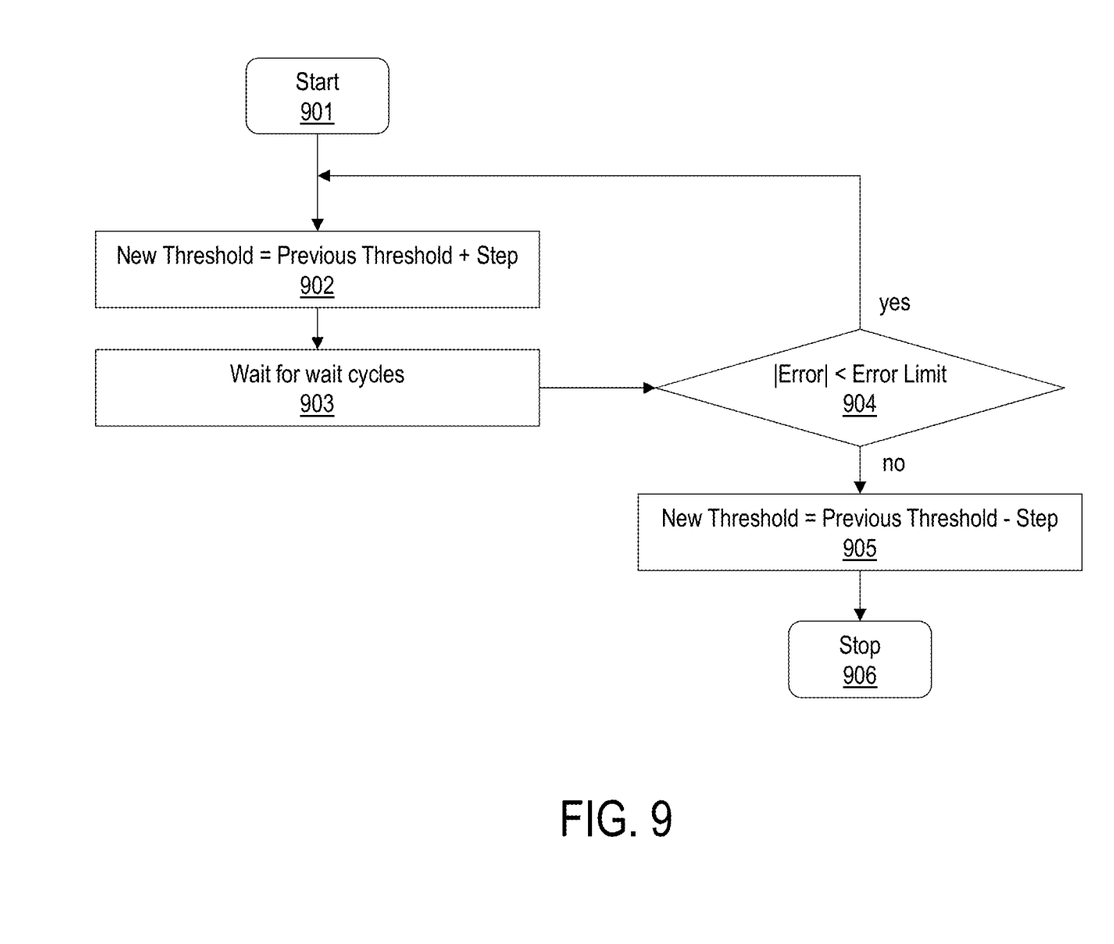
FIG. 9 is a flow chart for running a phase optimization state machine, according to one embodiment.

FIG. 9 is a flow chart for running a phase optimization state machine, according to one embodiment. The phase optimization state machine starts (901). The phase optimization state machine sets a new threshold to a sum of the previous threshold and a step size (902) and waits for wait cycles (903). The phase optimization state machine calculates an absolute error and compares with the error limit (904). If the absolute value of the error is less than the error limit, the phase optimizer increases the threshold by the step size and start another reiteration. If the absolute value of the error is greater than the error limit, the phase optimizer decreases the threshold (905) and stop the current phase optimization (906).

Figure 10:
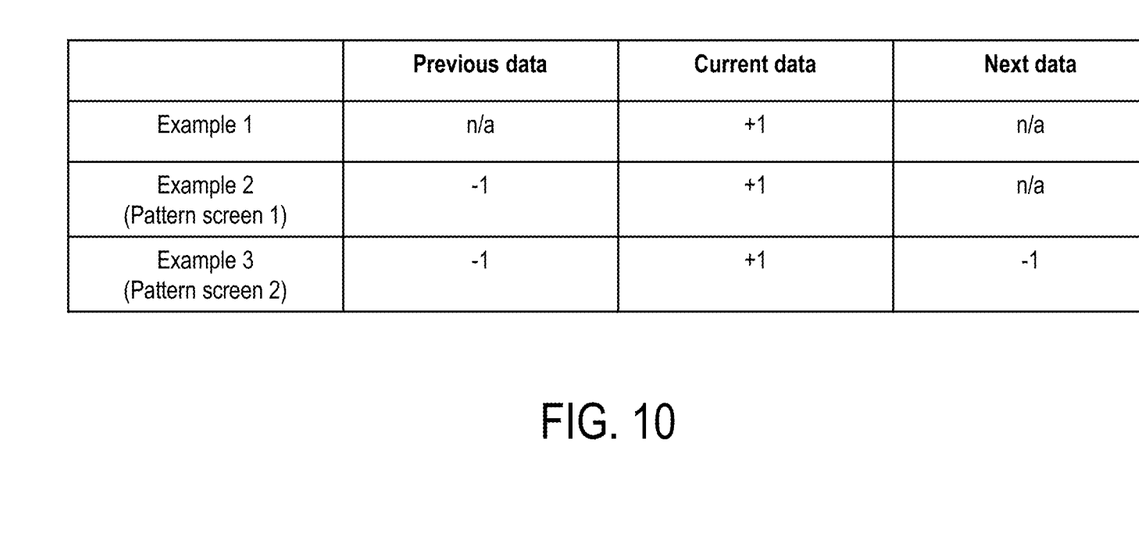
FIG. 10 shows three different pattern screening schemes.

According to one embodiment, the present phase detector employs pattern screening to incoming data (error signals) to improve the performance of the timing recovery. For high loss channels, the eye is closed if all possible signal values are considered, and thus the CDR may make a lot of errors. The present single slicer CDR scheme can avoid this error by considering only some transitions as described in the signal transition patterns described with respect to FIG. 10. The eye for these signal transition patterns has a lot less intersymbol interference (ISI) and is thus more open. The receiver can condition this 'error' production on the input data pattern. FIG. 10 shows three different pattern screening schemes. In one embodiment, the present data detector uses only the current data producing an error of +1 or −1 for each incoming data (once per clock cycle) with no pattern screening. In another embodiment, the present phase detector uses both previous data and the current data, particularly, the data pattern changing from −1 to +1. In yet another embodiment, the present phase detector uses three consecutive data in a row signifying a data pattern of −1, +1, and −1.

In the pattern screening, the error slicer recognizes both positive and negative signals. For example, the phase detector produces an error, i.e., +1 or −1, for each incoming data as long as the data voltage greater than 0. In this case, the phase detector 121 uses input signals greater than 0 (half of the total data) to save power. In another embodiment, the error slicer can generate errors in inputs less than 0. In this case, the error slicer generates a positive error (+1) when the input is less than the threshold, and the phase detector outputs bit 1 to increase the frequency of the VCO. When the input is greater than the threshold, the error slicer generates a negative error (−1), and the phase detector outputs bit 0 to decrease the frequency of the VCO.

Figure 11:
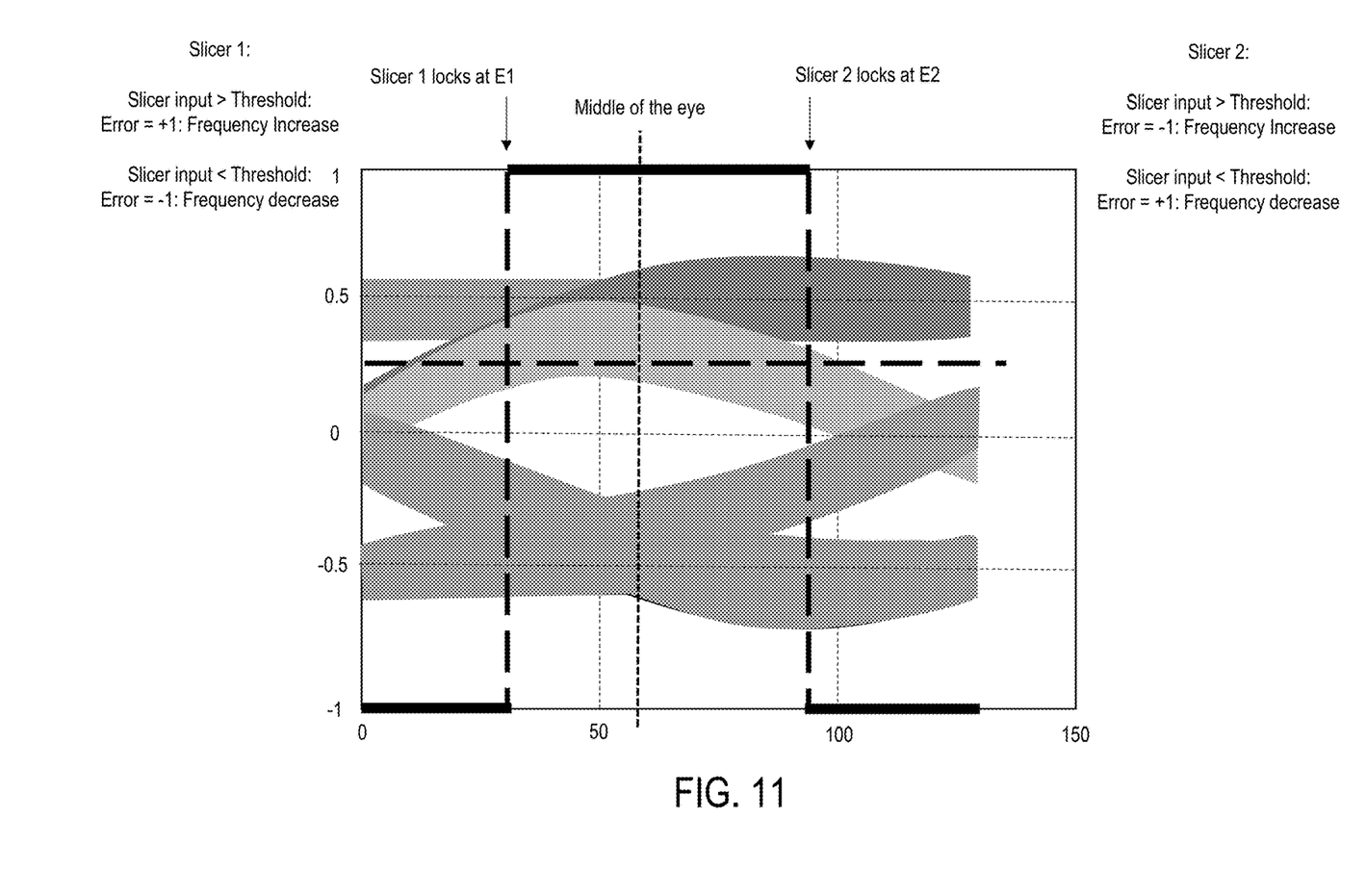
FIG. 11 shows an example data eye diagram illustrating phase locking with two slicers, according to one embodiment.

According to one embodiment, the present system and method can provide phase optimization using two slicers. Each of the slicers can use different sign for error, and can lock onto two different phases. FIG. 11 shows an example data eye diagram illustrating phase locking with two slicers, according to one embodiment. The middle of the eye, i.e., the phase with the maximum vertical eye opening is in the middle of the phases of the two slicers. The middle of the eye is the best position to sample for the error sampler.

The first slicer can employs the logic of increasing the frequency when the slicer input is greater than the threshold. The second slicer can employ a different logic in which the frequency is increased when the slice input is less than the threshold. In this way, the first slicer can lock at the phase E1 whereas the second slicer can lock at the phase E2. The logic inside the second slicer has its sign reversed so the phase E2 becomes stable for the second slicer, and the phase E1 becomes unstable. The two-slicer scheme is especially useful when using a phase interpolator. In this case, the maximum eye opening can be 'dialed in' using a digital code. The phase interpolator may be a circuit that can change the clock phase by small values between 0 degrees and 360 degrees. In a two-slicer scheme, if the first slicer is on phase 30 degrees and the second slicer is on phase 200 degrees, the maximum eye opening phase can be assumed to be (30+200)/2=115 degrees, The present system and method employs a timing recovery scheme implementing and utilizing only one slicer, i.e., an error slicer. The phase detector generates a bit signal (1 or 0) based on the output of the error slicer. The present system and method can improve the locking behavior of the phase locking algorithm and provide additional feature for phase optimization.

Each of the features and teachings disclosed herein can be utilized separately or in conjunction with other features and teachings to provide an efficient timing recovery in high speed links using a single slicer. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

According to one embodiment, an apparatus for providing timing recovery in high speed links includes: an error sampler receiving an input signal and sampling the input signal; a phase detector comprising an error slicer; and a voltage-controlled oscillator (VCO). The error slicer generates an error signal corresponding to the input signal with respect to a voltage threshold. The phase detector generates a bit data corresponding to the error signal. The VCO changes a frequency of an output signal based on the bit data and locks the frequency at a phase in which an average of a plurality of input signals is equal to the voltage threshold.

The apparatus may be included in a serializer or a deserializer.

The apparatus may be deficient of a crossing slicer.

The voltage threshold may be initially determined based on a peak value of the input signal.

The apparatus may further include a digital logic including a low-pass filter (LPF).

The error sampler may generate a data eye diagram in which at least one equilibrium phase is defined, and the frequency of the output signal may move toward the at least one equilibrium phase in the data eye diagram.

The phase detector may include a phase optimizer, and the phase optimizer may run a state machine.

The state machine may update the voltage threshold by a step size based on an absolute value of the error signal with respect to an error limit and a wait cycle.

The phase detector may generate the bit data based on a data pattern of the error signal.

The phase detector may further include a second slicer, and the second slicer may generate a second error signal having an opposite polarity of the error signal generated by the slicer.

According to another embodiment, a method includes: receiving and sampling an input signal transmitted from a transmitter; generating an error signal corresponding to the input signal with respect to a voltage threshold using an error slicer; generating a bit data corresponding to the error signal using a phase detector; changing a frequency of an output signal based on the bit data; and locking the frequency at a phase in which an average of a plurality of input signals is equal to the voltage threshold.

The method may further include determining an initial value of the voltage threshold based on a peak value of the input signal.

The method may further include filtering the error signal using a low-pass filter (LPF).

The method may further include generating a data eye diagram in which at least one equilibrium phase is defined, and the frequency of the output signal may move toward the at least one equilibrium phase in the data eye diagram.

The method may further include optimizing the phase detector by running a state machine.

The state machine may update the voltage threshold by a step size based on an absolute value of the error signal with respect to an error limit and a wait cycle.

The phase detector may generate the bit data based on a data pattern of the error signal.

The phase detector may further include a second slicer, and the second slicer may generate a second error signal having an opposite polarity of the error signal generated by the slicer.

The above example embodiments have been described hereinabove to illustrate various embodiments of implementing a system and method for providing an efficient timing recovery in high speed links using a single slicer. Various modifications and departures from the disclosed example embodiments will occur to those having ordinary skill in the art. The subject matter that is intended to be within the scope of the present disclosure is set forth in the following claims.

What is claimed is:

1. An apparatus comprising:
   an error sampler receiving an input signal and sampling the input signal;
   a phase detector comprising an error slicer and a phase optimizer; and
   a voltage-controlled oscillator (VCO),
   wherein the error slicer generates an error signal corresponding to the input signal with respect to a voltage threshold,
   wherein the phase detector generates a bit data corresponding to the error signal,
   wherein the VCO changes a frequency of an output signal based on the bit data and locks the frequency at a phase in which an average of a plurality of input signals is equal to the voltage threshold, and
   wherein the phase optimizer updates the voltage threshold by comparing an absolute value of the error signal and an error limit.

2. The apparatus of claim 1, wherein the apparatus is included in a serializer or a deserializer.

3. The apparatus of claim 1, wherein the apparatus is deficient of a crossing slicer.

4. The apparatus of claim 1, wherein the voltage threshold is initially determined based on a peak value of the input signal.

5. The apparatus of claim 1, wherein the apparatus further comprises a digital logic including a low-pass filter (LPF).

6. The apparatus of claim 1, wherein the error sampler generates a data eye diagram in which at least one equilibrium phase is defined, and wherein the frequency of the output signal moves toward the at least one equilibrium phase in the data eye diagram.

7. The apparatus of claim 1, wherein the phase optimizer runs a state machine.

8. The apparatus of claim 7, wherein the state machine updates the voltage threshold by a step size based on the absolute value of the error signal with respect to the error limit and a wait cycle.

9. The apparatus of claim 1, wherein the phase detector generates the bit data based on a data pattern of the error signal.

10. The apparatus of claim 1, wherein the phase detector further comprises a second slicer, and wherein the second slicer generates a second error signal having an opposite polarity of the error signal generated by the slicer.

11. A method comprising:
    receiving and sampling an input signal transmitted from a transmitter;
    generating an error signal corresponding to the input signal with respect to a voltage threshold using an error slicer;
    generating a bit data corresponding to the error signal using a phase detector;
    changing a frequency of an output signal based on the bit data;
    locking the frequency at a phase in which an average of a plurality of input signals is equal to the voltage threshold; and
    updating the voltage threshold by comparing an absolute value of the error signal and an error limit.

12. The method of claim 11, further comprising determining an initial value of the voltage threshold based on a peak value of the input signal.

13. The method of claim 11, further comprising filtering the error signal using a low-pass filter (LPF).

14. The method of claim 11, further comprising generating a data eye diagram in which at least one equilibrium phase is defined, and wherein the frequency of the output signal moves toward the at least one equilibrium phase in the data eye diagram.

15. The method of claim 11, further comprising running a state machine for updating the voltage threshold.

16. The method of claim 15, wherein the state machine updates the voltage threshold by a step size based on the absolute value of the error signal with respect to the error limit and a wait cycle.

17. The method of claim 11, wherein the phase detector generates the bit data based on a data pattern of the error signal.

18. The method of claim 11, wherein the phase detector further comprises a second slicer, and wherein the second slicer generates a second error signal having an opposite polarity of the error signal generated by the slicer.

* * * * *